(12) United States Patent
Seo et al.

(10) Patent No.: US 11,812,547 B2
(45) Date of Patent: Nov. 7, 2023

(54) MEMORY MODULE FOR PROTECTION OF A CIRCUIT, A MEMORY MODULE PROTECTION DEVICE, AND A MEMORY MODULE PROTECTION SYSTEM

(71) Applicant: SAMSUNG ELECTRONICS CO., LTD., Suwon-si (KR)

(72) Inventors: Dongyoon Seo, Seoul (KR); Sangkeun Kwak, Seoul (KR); Dohyung Kim, Seoul (KR); Kyeongseon Park, Seoul (KR); Hwanwook Park, Seoul (KR); Wonseop Lee, Daegu (KR); Daae Heo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 218 days.

(21) Appl. No.: 17/356,940

(22) Filed: Jun. 24, 2021

(65) Prior Publication Data
US 2022/0070999 A1    Mar. 3, 2022

(30) Foreign Application Priority Data
Sep. 3, 2020 (KR) .......................... 10-2020-0112634

(51) Int. Cl.
*H05K 1/00* (2006.01)
*H05K 1/02* (2006.01)
*H05K 1/14* (2006.01)

(52) U.S. Cl.
CPC ......... *H05K 1/0263* (2013.01); *H05K 1/0296* (2013.01); *H05K 1/142* (2013.01); *H05K 2201/10159* (2013.01)

(58) Field of Classification Search
CPC .... H05K 1/0263; H05K 1/0296; H05K 1/142; H05K 2201/10159
See application file for complete search history.

(56) References Cited

U.S. PATENT DOCUMENTS

| | | | | |
|---|---|---|---|---|
| 5,172,063 A | * | 12/1992 | Munikoti | G01R 31/281 324/763.01 |
| 5,392,219 A | * | 2/1995 | Birch | G01R 31/2817 714/E11.154 |
| 6,326,555 B1 | | 12/2001 | McCormack et al. | |
| 7,095,623 B2 | * | 8/2006 | Suwa | H05K 3/4641 174/262 |

(Continued)

FOREIGN PATENT DOCUMENTS

| KR | 10-0645645 | 11/2006 |
|---|---|---|
| KR | 10-1039775 | 6/2011 |

(Continued)

OTHER PUBLICATIONS

KR 101733076 B1 English Translation; published in May 8, 2017 (Year: 2017).*

*Primary Examiner* — Pete T Lee
(74) *Attorney, Agent, or Firm* — F. Chau & Associates, LLC (57) ABSTRACT

A memory module including: a first printed circuit board; a first socket and a second socket; and a daisy chain pattern formed in a first region of the first printed circuit board and connected to the first socket and the second socket, wherein an electrical signal on the daisy chain pattern is transferred to a host device when the first socket and the second socket are connected to the host device.

20 Claims, 11 Drawing Sheets

(56) References Cited

U.S. PATENT DOCUMENTS

| | | |
|---|---|---|
| 7,800,385 B2 | 9/2010 | McElfresh et al. |
| 8,041,990 B2 | 10/2011 | O'Connor et al. |
| 9,658,280 B2 | 5/2017 | Munson et al. |
| 10,334,720 B1 | 6/2019 | Neves |
| 10,379,153 B1 | 8/2019 | Neves |
| 2005/0144584 A1* | 6/2005 | Chen .................. G06F 30/34 716/117 |
| 2006/0133055 A1* | 6/2006 | Uematsu ............. H05K 1/0233 257/E23.079 |
| 2009/0132977 A1 | 5/2009 | Yu et al. |
| 2009/0154040 A1 | 6/2009 | Tung et al. |
| 2010/0302829 A1 | 12/2010 | Lim |
| 2016/0232949 A1 | 8/2016 | Petivan, III et al. |
| 2018/0227150 A1 | 8/2018 | Kemmochi et al. |
| 2019/0373730 A1 | 12/2019 | Seo et al. |

FOREIGN PATENT DOCUMENTS

| | | |
|---|---|---|
| KR | 10-1077399 | 10/2011 |
| KR | 10-1474770 | 12/2014 |
| KR | 10-1572089 | 11/2015 |
| TW | 200919171 | 5/2009 |

\* cited by examiner

MEMORY MODULE FOR PROTECTION OF A CIRCUIT, A MEMORY MODULE PROTECTION DEVICE, AND A MEMORY MODULE PROTECTION SYSTEM

CROSS-REFERENCE TO RELATED APPLICATION

This application claims priority under 35 U.S.C. § 119 to Korean Patent Application No. 10-2020-0112634 filed on Sep. 3, 2020, in the Korean Intellectual Property Office, the disclosure of which is incorporated by reference herein in its entirety.

TECHNICAL FIELD

Embodiments of the present disclosure described herein relate to a memory module, a memory module protection device, and a memory module protection system, and more particularly, to a circuit and a system for protecting a circuit.

DISCUSSION OF RELATED ART

As a size of a working panel that is used to manufacture a printed circuit board (PCB), in which a memory chip is installed, increases, a deviation of copper wire etching may occur at each location in the printed circuit board where a memory chip is installed, thereby causing an impedance unbalance of the printed circuit board.

To correct the impedance unbalance of the printed circuit board described above, an impedance coupon may be installed in the printed circuit board to determine whether the printed circuit board is faulty.

However, in the case where the number of impedance coupons installed in the printed circuit board increases, an area where actual circuit elements are to be formed in the printed circuit board decreases. Consequently, the number of products to be installed in the printed circuit board may decrease.

SUMMARY

Embodiments of the present disclosure provide a circuit protection device and a circuit protection system capable of determining whether a printed circuit board is faulty, based on a characteristic of the printed circuit board detected through a daisy chain pattern installed in a region of the printed circuit board, in which components are inhibited from being installed, instead of conventional impedance coupons.

Embodiments of the present disclosure also provide a printed circuit board capable of being connected with an external host by installing a daisy chain pattern in a region of a printed circuit board, in which components are inhibited from being installed.

According to an embodiment of the present disclosure, there is provided a memory module including: a first printed circuit board; a first socket and a second socket; and a daisy chain pattern formed in a first region of the first printed circuit board and connected to the first socket and the second socket, wherein an electrical signal on the daisy chain pattern is transferred to a host device when the first socket and the second socket are connected to the host device.

According to an embodiment of the present disclosure, there is provided a memory module protection circuit including: a first printed circuit board; a first socket and a second socket connectable with a host device; and a daisy chain pattern formed in an edge region of the first printed circuit board and connected with the first socket and the second socket, wherein the host device determines a characteristic of the first printed circuit board based on information about an electrical signal of the daisy chain pattern.

According to an embodiment of the present disclosure, there is provided a memory module protection system including: a first printed circuit board; a first socket and a second socket connectable with a host device provided outside the memory module protection system; and a daisy chain pattern provided in an edge region of the first printed circuit board and connected with the first socket and the second socket, wherein the host device determines a characteristic of the first printed circuit board based on information about an electrical signal of the daisy chain pattern.

BRIEF DESCRIPTION OF THE FIGURES

The above and other features of the present disclosure will become apparent by describing in detail embodiments thereof with reference to the accompanying drawings.

DETAILED DESCRIPTION OF THE EMBODIMENTS

Like reference numerals may denote like elements throughout the specification. In the specification, terms such as parts, modules, members, and blocks may be realized using software or hardware, and a plurality of parts, modules, members, and blocks may be realized in a single element, or one part, module, member, or block may include a plurality of elements.

Throughout the specification, when a part is referred to as being "connected" to another part, this term may include "directly connected" and "indirectly connected." For example, "indirectly connected" may include "connected through a wireless communication network."

In addition, when a part "includes" an element, another element may be further included.

Terms such as first, second, and the like are used herein to distinguish one element from another element, and the elements are not limited to the above-described terms.

As used herein, singular forms "a" and "an" are intended to include the plural forms as well, unless the context clearly indicates otherwise.

Reference numerals in operations are used for the sake of convenience in description and may not limit an order of the operations. For example, the operations may be performed through an order different from the described order unless the context clearly indicates a specific order.

Hereinafter, embodiments of the present disclosure will be described with reference to the accompanying drawings.

Figure 1:
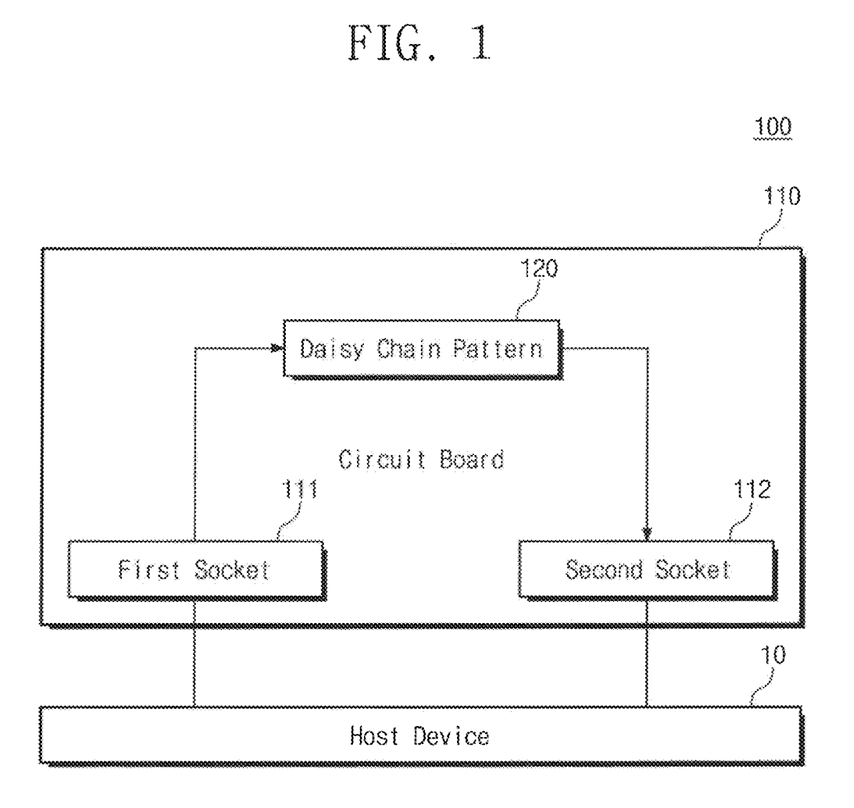
FIG. 1 is a block diagram of a memory module according to an embodiment of the present disclosure.

FIG. 1 is a block diagram of a memory module 100 according to an embodiment of the present disclosure.

Referring to FIG. 1, the memory module 100 includes a circuit board 110, a daisy chain pattern 120, and a host device 10, and the circuit board 110 and the host device 10 are connected through a first socket 111 and a second socket 112. Here, the circuit board 110 may include, but is not limited to, a printed circuit board (PCB) or a flexible circuit board. Hereinafter, an embodiment of a printed circuit board will be described below. In other words, the circuit board 110 will now be referred to as a printed circuit board 110.

The printed circuit board 110 may be a circuit board that is used to form an electronic circuit by fastening electronic components such as a resistor, a capacitor, and an integrated circuit on a surface thereof and connecting the electronic components with copper wires. The printed circuit board 110 may include an outer region and an inner region. Here, the outer region of the printed circuit board 110 may be a region where components are inhibited from being installed. The outer region may be arranged along a longitudinal edge of the printed circuit board 110 and have a width of about 3.6 mm or be arranged along a transverse edge of the printed circuit board 110 and have a width of about 1.5 mm, but is not limited thereto. The inner region of the printed circuit board 110 may be a region (or a zone) in which components or circuit elements are installed. Memory chips may be installed in the inner region of the printed circuit board 110.

The memory module 100 according to an embodiment of the present disclosure may operate in a high-speed digital system. In addition, a plurality of printed circuit boards 110 may be connected. In this case, each of the plurality of printed circuit boards 110 may be called a "first printed circuit board", a "second printed circuit board", or an "n-th printed circuit board".

The daisy chain pattern 120 may be installed in the outer region of the printed circuit board 110 and may be used to detect a current flowing at the printed circuit board 110 or a signal having an electrical characteristic.

For example, the daisy chain pattern 120 may be connected with the host device 10 external to the printed circuit board 110 and may provide the host device 10 with a current flowing through the printed circuit board 110 or an electrical signal propagated through the printed circuit board 110. As will be described later, the host device 10 may be provided with a current or an electrical signal from the daisy chain pattern 120 and may determine a characteristic of the printed circuit board 110 based on the current or the electrical signal provided from the daisy chain pattern 120. Here, the characteristic of the printed circuit board 110 may include an impedance or a propagation delay.

The daisy chain pattern 120 may be formed at a location of the printed circuit board 110 at which there are no electrical attributes for the sake of appearance. For example, the daisy chain pattern 120 is formed through a dummy net present in the printed circuit board 110. Here, the dummy net may be a location of the printed circuit board 110, which is viewed as if electricity does not flow for the sake of appearance because circuit elements or memory chips are not installed at the location. Since the daisy chain pattern 120 is formed through dummy nets, the daisy chain pattern 120 may allow an electrical signal, which is the basis for determining a characteristic of the printed circuit board 110, to propagate.

In addition, since the daisy chain pattern 120 is installed in the outer region of the printed circuit board 110, the daisy chain pattern 120 may protect circuits or memory chips installed in the inner region of the printed circuit board 110 against a damage coming from the outside. In the case where the daisy chain pattern 120 is absent from the outer region of the printed circuit board 110, an element or a circuit that is present within the printed circuit board 110 may be broken by a damage from the outside. In contrast, in the case where the daisy chain pattern 120 is installed in the outer region of the printed circuit board 110, the daisy chain pattern 120 may absorb a damage from the outside, and thus, the daisy chain pattern 120 may protect the inside of the printed circuit board 110. A process in which the daisy chain pattern 120 protects memory chips against a damage coming from the outside will be more fully described with reference to FIGS. 4A, 4B, and 4C.

The first socket 111 and the second socket 112 are installed in the printed circuit board 110 to connect the daisy chain pattern 120 with the host device 10 outside the printed circuit board 110. For example, since opposite ends of the daisy chain pattern 120 are connected to the first socket 111 and the second socket 112 and the printed circuit board 110 is connected with the host device 10 by using the first socket 111 and the second socket 112 as a contact point, the daisy chain pattern 120 may be connected with the host device 10. For example, a first end of the daisy chain pattern 120 may be connected to the first socket 311 and a second end of the daisy chain pattern 120 may be connected to the second socket 112. Here, the first socket 111 and the second socket 112 may be installed in the form of, but is not limited to, a tap pin. For example, the first socket 111 and the second socket 112 may include any form capable of electrically connecting the host device 10 and the printed circuit board 110.

The host device 10 may be electrically connected with the printed circuit board 110 to perform various test operations for determining whether the printed circuit board 110 is faulty. For example, the host device 10 may include a processor, and the processor may determine a characteristic of the printed circuit board 110 based on an electrical signal received from the daisy chain pattern 120. As described above, the characteristic of the printed circuit board 110 may include an impedance or a propagation delay. In addition, based on the determined characteristic of the printed circuit board 110, the processor may determine whether the printed circuit board 110 is faulty. For example, in the case where a short circuit occurs in a circuit installed within the printed circuit board 110 or a faulty element is installed within the printed circuit board 110, an impedance value of the printed circuit board 110 may be different from an impedance value that is determined in advance or is intended by a memory vendor. In addition, a propagation delay rate may also be different from a propagation delay rate determined in advance.

When it is determined that the impedance value or the propagation delay rate of the printed circuit board 110 is different from a value determined in advance, the processor may determine the printed circuit board 110 connected with the host device 10 as faulty and may disconnect the host device 10 from the printed circuit board 110 such that a power is not supplied to the printed circuit board 110. In addition, when it is determined that the connection of the printed circuit boards 110 is faulty, the processor may disconnect the host device 10 from the printed circuit boards 110. For example, if the connection between two printed circuit boards 110 is faulty, the processor may disconnect the host device 10 from the printed circuit boards 110. In addition, when it is determined that damage has come from the outside of the memory module 100, the processor may protect a circuit on the printed circuit board 110 by offsetting signals generated in the inner region. Before the host device 10 and memory chips are connected, the processor may determine in advance whether the printed circuit board 110 or a plurality of printed circuit boards 110 are faulty.

Depending on the performance of components of the memory module 100 illustrated in FIG. 1, the memory module 100 may further include at least one component or may not include at least one of the components of the memory module 100. In addition, it should be understood by one skilled in the art that locations of the components of the memory module 100 may be changed depending on the performance or structure of system.

Figure 2:
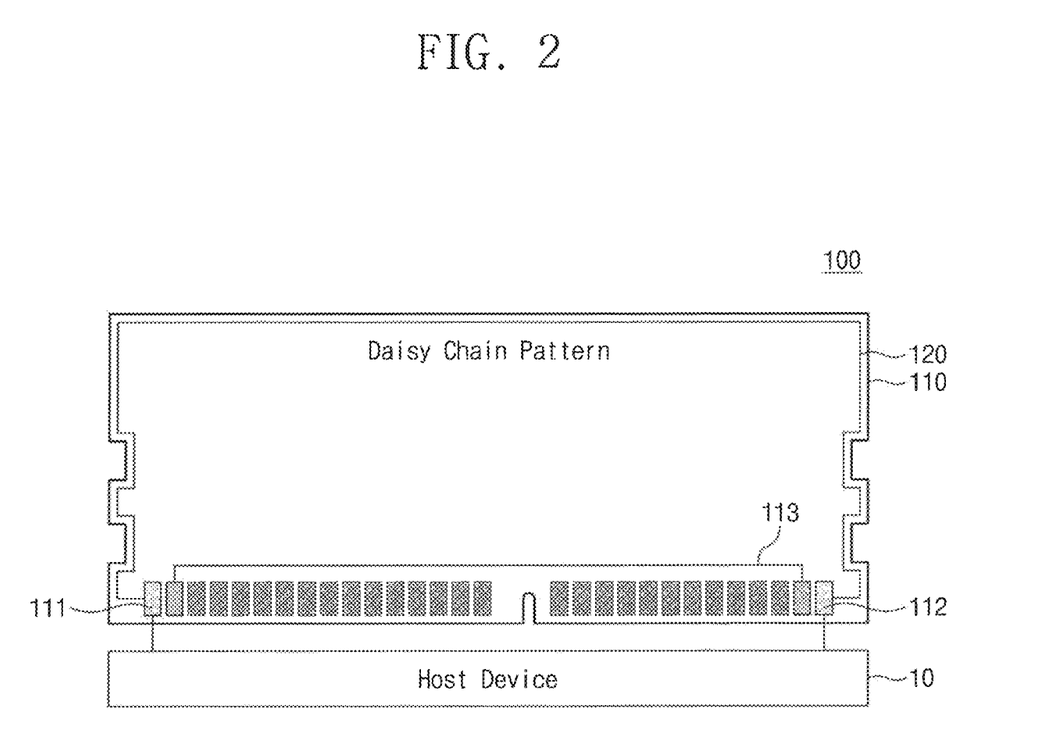
FIG. 2 illustrates a daisy chain pattern installed in a printed circuit board according to an embodiment of the present disclosure.

FIG. 2 illustrates the daisy chain pattern 120 installed in the printed circuit board 110 according to an embodiment of the present disclosure.

Referring to FIG. 2, the printed circuit board 110 may further include a plurality of sockets 113. Here, the sockets 113 may be sockets that connect the host device 10 and a memory chip installed in the inner region of the printed circuit board 110. The daisy chain pattern 120 may be connected with the host device 10 by using the first socket 111 and the second socket 112. In the case where the daisy chain pattern 120 is connected with the host device 10, before the sockets 113 are connected with the host device 10, the processor may determine whether the printed circuit board 110 is faulty. As described above, based on an electrical signal propagated through the daisy chain pattern 120, the processor may determine whether the printed circuit board 110 is faulty.

When it is determined that the printed circuit board 110 is faulty, the processor may not connect the host device 10 and the sockets 113. In this unconnected state, the memory chips installed in the inner region of the printed circuit board 110 are protected. In contrast, when it is determined that the printed circuit board 110 is normal, the processor may connect the sockets 113 and the host device 10, and thus, the host device 10 may recognize the memory chips.

Figure 3:
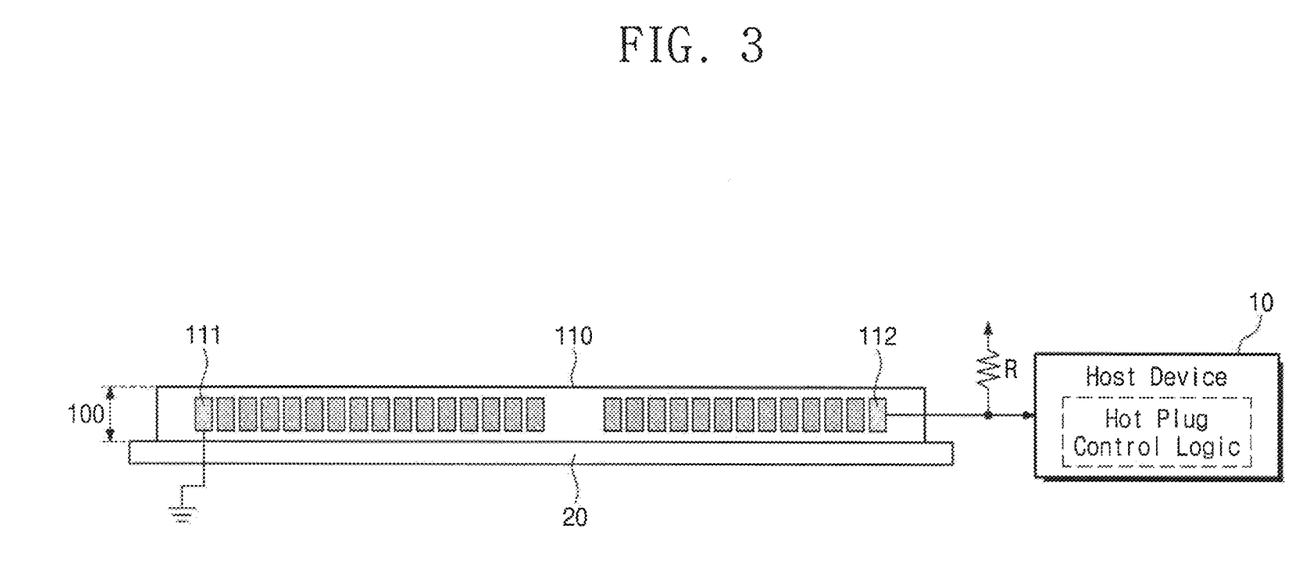
FIG. 3 illustrates an operation in which a host device tests a memory module according to an embodiment of the present disclosure.

FIG. 3 illustrates an operation in which the host device 10 tests the memory module 100 according to an embodiment of the present disclosure.

Referring to FIG. 3, as the printed circuit board 110 is installed in a system board 20, the printed circuit board 110 may be connected with the host device 10. Here, the system board 20 may be a device that allows the host device 10 to recognize the memory module 100. In addition, the system board 20 may be used to test the memory module 100. In addition, the processor of the host device 10 may include hot plug control logic. The hot plug control logic may store an algorithm or a program for protecting the memory module 100. The first socket 111 of the printed circuit board 110 may be connected with a ground terminal, and the second socket 112 of the printed circuit board 110 may be connected with the processor. Here, the first socket 111 of the printed circuit board 110 may be connected with a ground voltage applied from the host device 10.

Figure 4A:
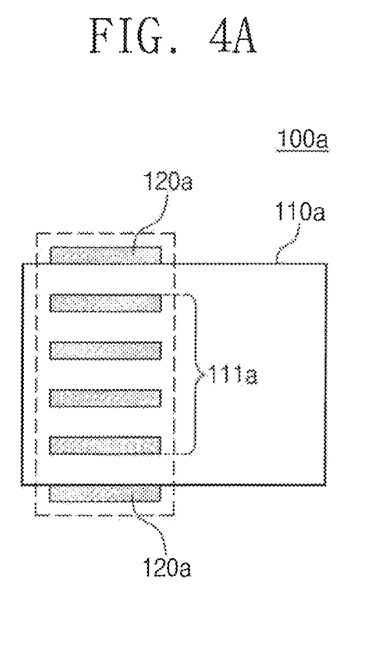
FIGS. 4A, 4B, and 4C illustrate a daisy chain pattern and internal components installed in a printed circuit board at regular intervals and how the inside of a printed circuit board is protected against a damage coming from the outside according to an embodiment of the present disclosure.
Figure 4B:
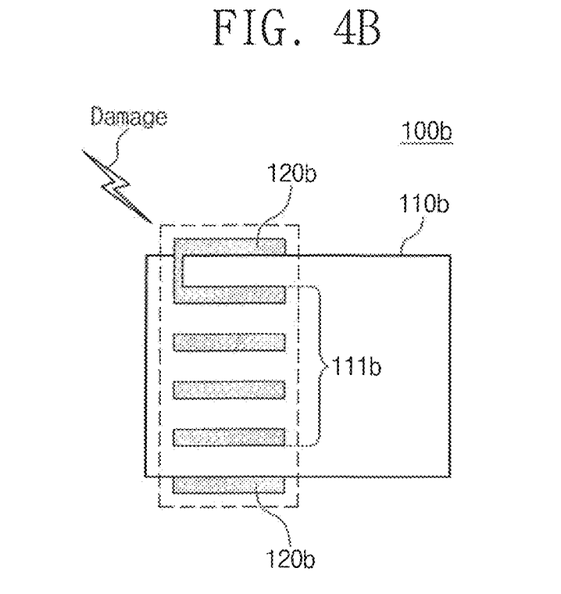
Figure 4C:
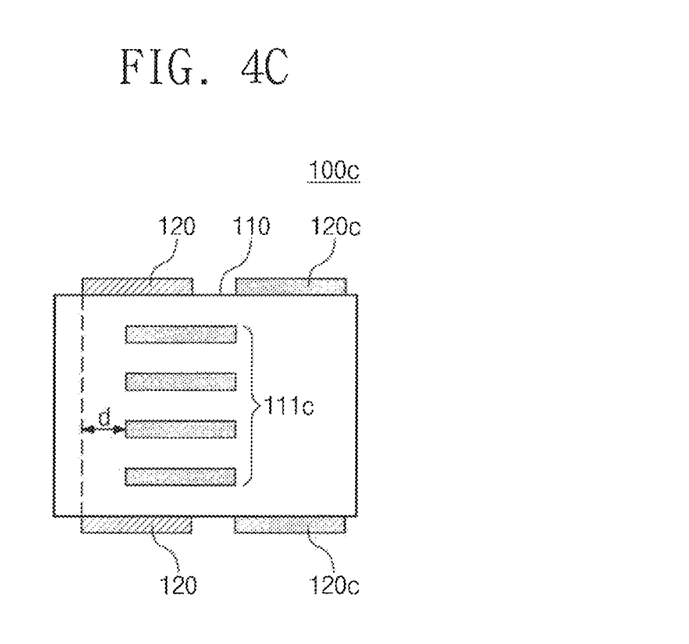

FIGS. 4A, 4B, and 4C illustrate processes according to an embodiment of the present disclosure in which the daisy chain pattern 120 protects the inside of the printed circuit board 110 against damage coming from the outside. For example, FIG. 4A illustrates a memory module 100a corresponding to the case where the daisy chain pattern 120 is not installed, FIG. 4B illustrates a memory module 100b corresponding to the case where the daisy chain pattern 120 is not installed and a damage occurs, and FIG. 4C illustrates a memory module 100c corresponding to the case where the daisy chain pattern 120 is installed and a damage comes from the outside.

Referring to FIG. 4A, in the case where a damage does not come from the outside, because wires are installed in an outer region and an inner region of a printed circuit board 110a at regular intervals, an external signal pattern 120a and an internal signal pattern 111a are input at regular intervals.

Referring to FIG. 4B, in the case where a damage comes from the outside, a signal that is transferred (or propagated) in a printed circuit board 110b may be influenced by the damage. For example, when a wire in the outer region of the printed circuit board 110b and a wire in the inner region of the printed circuit board 110b are electrically connected due to the external damage, an external signal pattern 120b and an internal signal pattern 111b may be short-circuited. When the external signal pattern 120b and the internal signal pattern 111b are short-circuited, a noise may occur at a plurality of signals. In this case, circuits or memory chips installed in the printed circuit board 110b may be damaged.

Referring to FIG. 4C, in the case where the daisy chain pattern 120 is installed in the outer region of the printed circuit board 110, the daisy chain pattern 120 absorbs a damage from the outside. Since the daisy chain pattern 120 absorbs the damage, wires installed adjacent to the outer region and wires installed in the inner region may not be electrically connected, thus making it possible to protect the wires against the damage. As a result, in the case where the daisy chain pattern 120 is installed in the outer region of the printed circuit board 110, even though a damage comes from the outside, an external signal pattern 120c and an internal signal pattern 111c may be input at regular intervals without a short circuit. Here, the daisy chain pattern 120 may be spaced apart from the inner region as much as a given distance "d". Here, the given distance "d" may be an interval sufficient to prevent a damage from the outside from being transferred to the inner region depending on a characteristic of the daisy chain pattern 120. In addition, the host device 10 may determine whether a damage comes from the outside of the memory module 100. For example, when it is determined that the damage comes from the outside of the memory module 100, the host device 10 may offset a signal of the outer region and a signal of the inner region.

Figure 5:
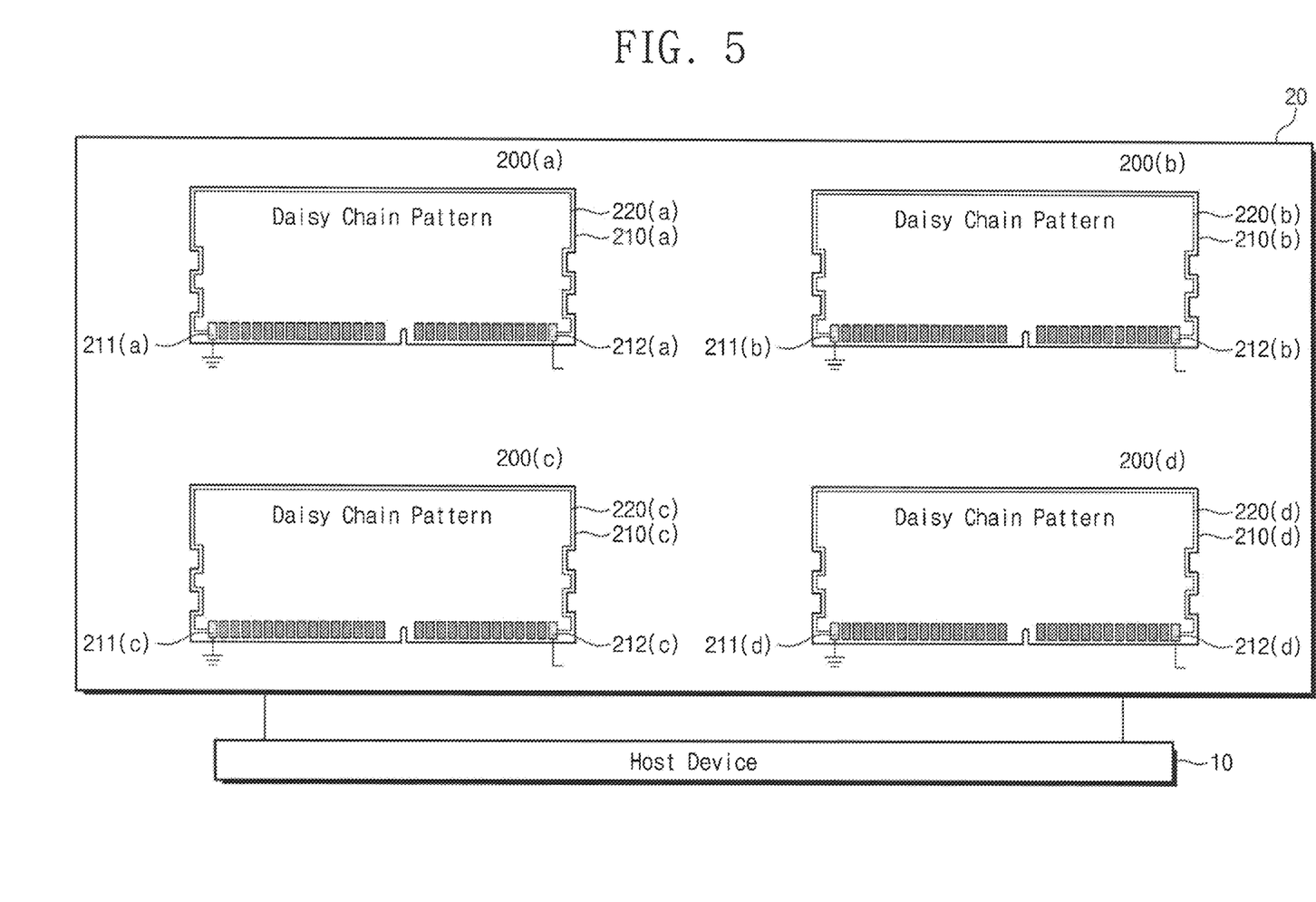
FIG. 5 illustrates a plurality of memory modules according to an embodiment of the present disclosure, which are installed on a system.

FIG. 5 illustrates a plurality of memory modules 200(a), 200(b), 200(c), and 200(d) according to an embodiment of the present disclosure, which are connected with the system board 20.

Referring to FIG. 5, the plurality of memory modules 200(a), 200(b), 200(c), and 200(d) according to an embodiment of the present disclosure may be installed in the system board 20. For convenience, four memory modules 200(a), 200(b), 200(c), and 200(d) are disclosed in FIG. 5, but the present disclosure is not limited thereto. For example, N memory modules 200(n) may be installed in the system board 20. In addition, for convenience, in the case where the plurality of memory modules 200(a), 200(b), 200(c), and 200(d) are connected, printed circuit boards 210(a), 210(b), 210(c), and 210(d) respectively included in the memory modules 200(a), 200(b), 200(c), and 200(d) may be referred to as a "first printed circuit board", a "second printed circuit board", and the like.

In addition, in the case where a test operation is performed on the plurality of memory modules 200(a), 200(b), 200(c), and 200(d) in a state where daisy chain patterns 220(a), 220(b), 220(c), and 220(d) of the plurality of printed circuit boards 210(a), 210(b), 210(c), and 210(d) are connected in a daisy chain manner, the processor (of the host) may determine a connection state of the printed circuit boards 210(a), 210(b), 210(c), and 210(d). For example, the memory modules 200(a), 200(b), 200(c), and 200(d) may be installed in the system board 20 to be connected in parallel and may be connected with one host device 10. First sockets 211(a), 211(b), 211(c), and 211(d) respectively included in the memory modules 200(a), 200(b), 200(c), and 200(d) may be connected with the host device 10 and may be supplied with the ground voltage, and second sockets 212(a), 212(b), 212(c), and 212(d) respectively included in the memory modules 200(a), 200(b), 200(c), and 200(d) may be connected with the processor of the host device 10. The host device 10 may independently determine characteristics of the memory modules 200(a), 200(b), 200(c), and 200(d).

The host device 10 may determine whether the plurality of printed circuit boards 210(a), 210(b), 210(c), and 210(d) thus connected are faulty, simultaneously and independently. For example, the host device 10 may respectively determine characteristics of the plurality of printed circuit boards 210(a), 210(b), 210(c), and 210(d) and may determine a faulty memory module. For example, based on a characteristic of the printed circuit board 210(a), the host device 10 may determine the memory module 200(a) to be faulty, and based on a characteristic of the printed circuit board 210(a), the host device 10 may determine the memory module 200(b) to be faulty. In addition, the host device 10 may determine a connection state of the plurality of printed circuit boards 210(a), 210(b), 210(c), and 210(d) connected therewith. For example, when an abnormal electrical signal is detected even though an impedance or a propagation delay characteristic coincides with an impedance or a propagation delay characteristic predicted in advance, the host device 10 may determine that the connection state of the plurality of printed circuit boards 210(a), 210(b), 210(c), and 210(d) is faulty or may determine that a connection state of at least one of the plurality of printed circuit boards 210(a), 210(b), 210(c), and 210(d) is faulty.

Figure 6:
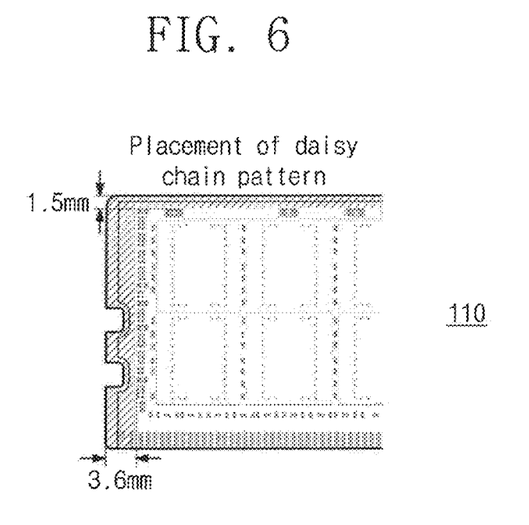
FIG. 6 illustrates a zone of a printed circuit board, in which a daisy chain pattern according to an embodiment of the present disclosure is installed.

FIG. 6 illustrates a zone of the printed circuit board 110, in which the daisy chain pattern 120 according to an embodiment of the present disclosure is installed.

The daisy chain pattern 120 according to an embodiment of the present disclosure is installed in the outer region of the printed circuit board 110. Referring to FIG. 6, the outer region of the printed circuit board 110, which corresponds to a shading portion, is a region where components are inhibited from being installed, and the inner region of the printed circuit board 110 is a region of the printed circuit board 110, in which components are installed. Here, a component installed in the printed circuit board 110 may include, but is not limited to, a memory chip.

As described above, the printed circuit board 110 may include memory chips in the inner region. When the memory module 100 is coupled with the system board 20, to prevent the interference between the sockets 113 and the memory module 100, the memory chips are spaced from an edge of the printed circuit board 110 by as much as a given distance. Here, the given distance that is used to determine the region where components are inhibited from being installed may be about 3.0 mm to about 3.6 mm from a longitudinal edge of the printed circuit board 110 and may be about 0.5 mm to about 1.5 mm from a transverse edge of the printed circuit board 110. However, the present disclosure is not limited thereto. For example, a range where components are inhibited from being installed may be variously changed or modified.

Figure 7:
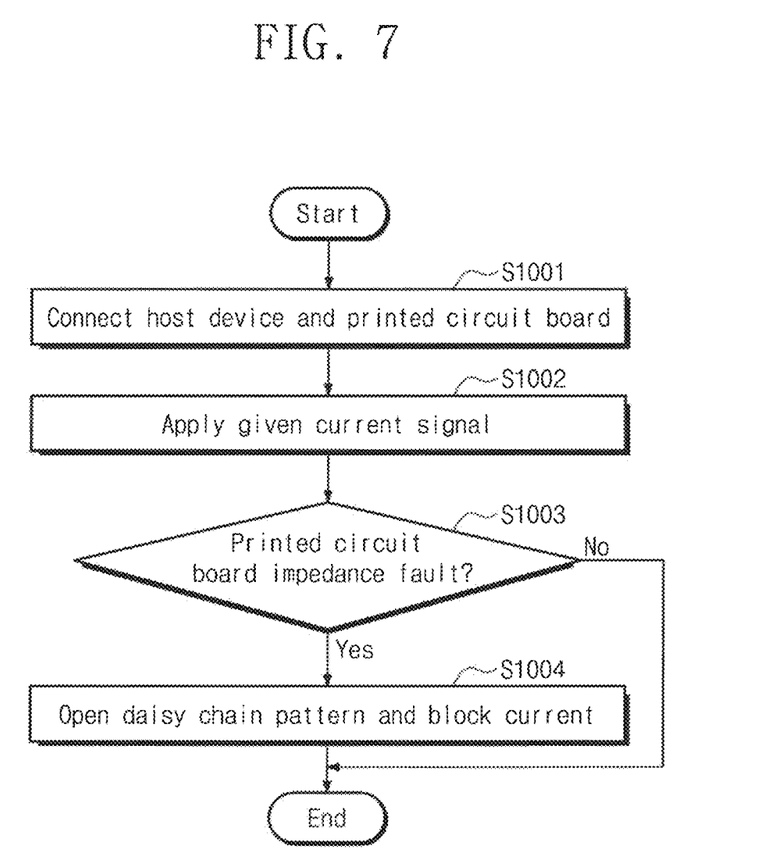
FIG. 7 illustrates how a memory module protection system according to an embodiment of the present disclosure determines whether a circuit is faulty.

FIG. 7 illustrates how a memory module protection system according to an embodiment of the present disclosure determines whether the memory module 100 is faulty.

The printed circuit board 110 is connected with the system board 20 to determine whether the memory module 100 is faulty (S1001). Here, the printed circuit board 110 and the host device 10 may be connected by connecting the first socket 111 and the second socket 112 of the printed circuit board 110 with the system board 20.

After the printed circuit board 110 is connected with the host device 10, the host device 10 applies a given current to the printed circuit board 110 (S1002). Here, the given current is a current that makes it possible to determine a characteristic of the printed circuit board 110 without breaking down the printed circuit board 110. In addition, the daisy chain pattern 120 may detect the current applied to the printed circuit board 110.

As the daisy chain pattern 120 detects the current applied to the printed circuit board 110, the host device 10 determines whether the printed circuit board 110 is faulty (S1003). For example, in the case where an impedance of the printed circuit board 110 is different from a given impedance or it is determined that a circuit is short-circuited, the host device 10 determines that the printed circuit board 110 is faulty.

When it is determined that the printed circuit board 110 is faulty, the host device opens the daisy chain pattern 120 and blocks a current to the first socket 111, the second socket 112, and the sockets 113. When it is determined that the printed circuit board 110 is not faulty, the memory module 100 and the host device 10 are connected without blocking a current from being provided to the daisy chain pattern 120, the first socket 111, the second socket 112, and the sockets 113 (S1004).

Figure 8:
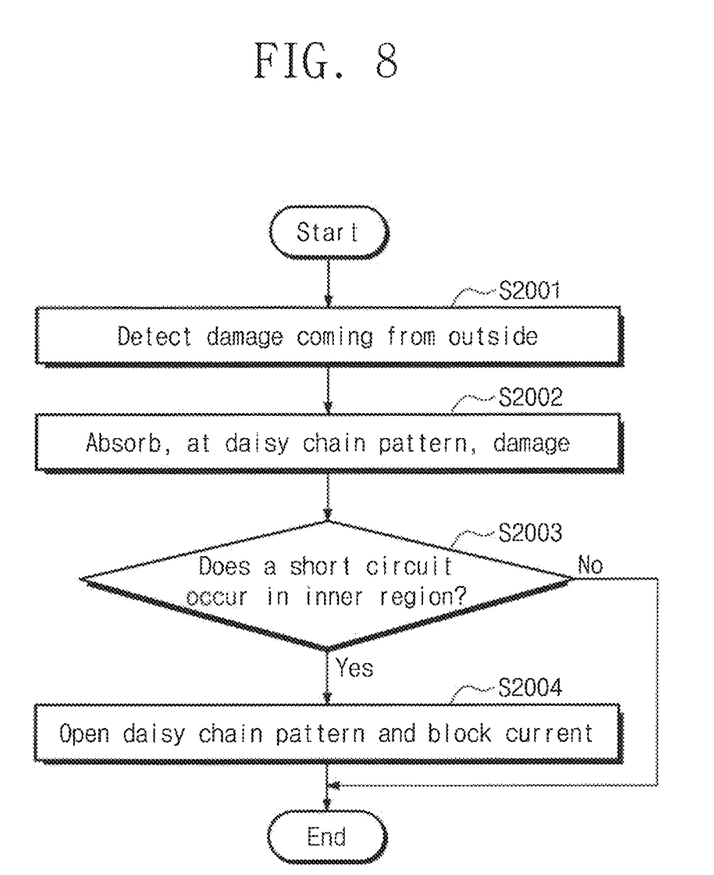
FIG. 8 illustrates a process in which a memory module protection system according to an embodiment of the present disclosure protects a circuit against a damage coming from the outside.

FIG. 8 illustrates a process in which the daisy chain pattern 120 according to an embodiment of the present disclosure protects a memory module against a damage coming from the outside.

The daisy chain pattern 120 installed in the outer region of the printed circuit board 110 detects a damage coming from the outside (S2001) and absorbs the detected damage (S2002).

After the daisy chain pattern 120 absorbs the detected damage, the host device 10 determines whether a short circuit occurs at a signal of the printed circuit board 110 (S2003). For example, with reference to FIG. 4C, in the case where a damage comes from the outside, the external signal pattern 120c and the internal signal pattern 111c of the printed circuit board 110 may be short-circuited. In this case, the host device 10 may detect the signal of the printed circuit board 110 from the daisy chain pattern 120 and determine whether a short circuit occurs at the signal of the printed circuit board 110.

When it is determined that the short circuit occurs at the signal of the printed circuit board 110, the host device 10 blocks a current to the first socket 111, the second socket 112, and the sockets 113 and opens the daisy chain pattern 120 (S2004). However, when it is determined that the short circuit does not occur at the signal of the printed circuit board 110, the host device 10 connects the memory module 100 and a system without blocking a current of the daisy chain pattern 120, the first socket 111, the second socket 112, the sockets 113, and the host device 10.

Figure 9:
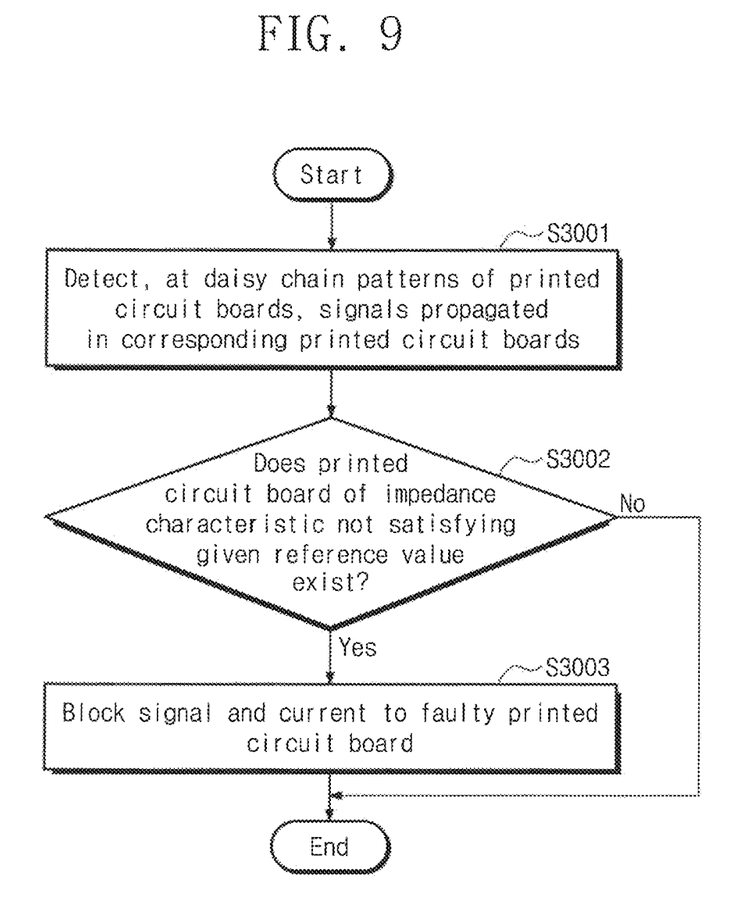
FIG. 9 illustrates a process of determining, at a memory module protection system according to an embodiment of the present disclosure, a faulty circuit when a plurality of printed circuit boards are connected.

FIG. 9 illustrates a process of determining, at the memory module 100 according to an embodiment of the present disclosure, a faulty circuit when a plurality of printed circuit boards 110 are connected.

Each of the daisy chain patterns 120 respectively installed in the printed circuit boards 110 detects a characteristic of the corresponding printed circuit boards 110 (S3001). For example, before the memory module 100 and the host device 10 are connected, the host device 10 is connected with the daisy chain patterns 120 through the first sockets 111 and the second sockets 112 and determines characteristics of the printed circuit boards 110.

After the characteristics of the printed circuit boards 110 are determined, the host device 10 determines whether at least one of the printed circuit boards 110 has an impedance characteristic that does not satisfy a given reference (S3002). Here, the given reference may be a unique impedance of the printed circuit board 110 or an impedance of the printed circuit board 110 where a memory chip is installed.

When it is determined that there is a printed circuit board 110 whose impedance characteristic does not satisfy the given reference, the host device 10 blocks a current to the first socket 111, the second socket 112, and the sockets 113 of the printed circuit board 110 determined as faulty and opens the daisy chain pattern 120 (S3003). However, when all or some of the printed circuit boards 110 are determined as having an impedance coinciding with the given reference, the host device 10 connects the memory module 100 and a system without blocking a current to the first socket 11*l*, the second socket 112, and the sockets 113 to all or some of the printed circuit boards 100.

Figure 10:
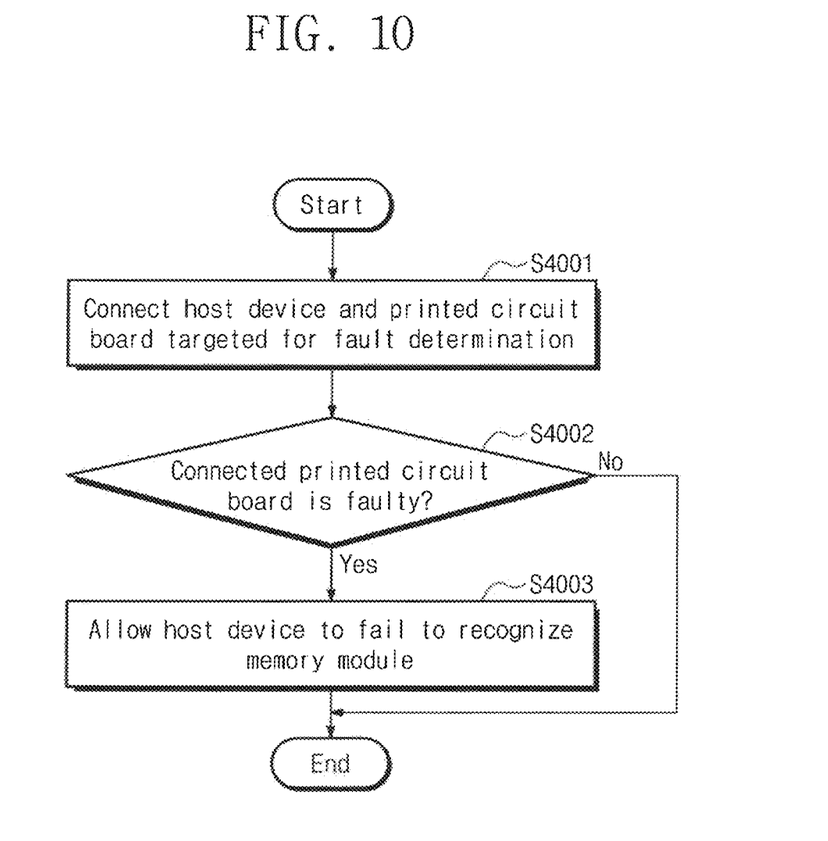
FIG. 10 illustrates a process of determining in advance whether a circuit is faulty, before a memory module protection system according to an embodiment of the present disclosure applies a power to a circuit.

FIG. 10 illustrates a process of determining in advance whether the printed circuit board 110 is faulty, before a power is applied to the memory module 100 according to an embodiment of the present disclosure.

To determine whether the printed circuit board 110 is faulty, before the host device 10 and the memory module 100 including the printed circuit board 110 are connected, the host device 10 is connected with the memory module 100 targeted for fault determination (S4001).

After the host device 10 is connected with the memory module 100 targeted for fault determination, whether the printed circuit board 110 is faulty is determined through at least one of the processes of FIGS. 7 and 8 (S4002).

When it is determined that the printed circuit board 110 is a faulty printed circuit board, the host device 10 blocks a current to the faulty printed circuit board such that the host device 10 fails to recognize the memory module 110 including the faulty printed circuit board (S4003). In contrast, when it is determined that the printed circuit board 110 is a normal printed circuit board, the host device 10 is connected with the memory module 100 including the normal printed circuit board 110 and applies a current to the memory module 100 connected therewith, so as to operate.

It is to be understood that the disclosed embodiments can be implemented as a recording medium storing instructions executable by a computer. The instructions can be stored in the form of a program code, and may generate, when executed by a processor, a program module such that operations of the disclosed embodiments can be performed. The recording medium can be implemented as a computer-readable recording medium.

The computer-readable recording medium includes all kinds of recording media in which instructions capable of being interpreted by the computer are stored. For example, the computer-readable recording medium may include a read only memory (ROM), a random access memory (RAM), a magnetic tape, a magnetic disc, a flash memory, an optical data storage device, and the like.

By including the above configuration, the circuit protection circuit and system disclosed may determine whether a printed circuit board is faulty, based on a characteristic of the printed circuit board detected through a daisy chain pattern.

In addition, the printed circuit board disclosed may include a daisy chain pattern installed in a component installation-inhibited region to be connected with an external host and thus may allow the external host to determine a characteristic of the printed circuit board.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory module, comprising:
    a first printed circuit board having first and third edges opposite each other and second and fourth edges opposite each other;
    a first socket and a second socket;
    a plurality of sockets disposed between the first socket and the second socket, wherein the plurality of sockets and the first and second sockets are disposed at the first edge; and
    a daisy chain pattern formed in a first region of the first printed circuit board and connected to the first socket and the second socket, wherein the daisy chain pattern extends from the first socket along the second edge, the third edge and the fourth edge to the second socket, and wherein an electrical signal on the daisy chain pattern is transferred to a host device when the first socket and the second socket are connected to the host device.

2. The memory module of claim 1, further comprising a second printed circuit disposed with the first printed circuit board on a system board,
    wherein a daisy chain pattern is formed in a first region of the second printed circuit board, and
    wherein the daisy chain pattern of the first printed circuit board and the daisy chain pattern of the second printed circuit board transfer electrical signals to the host device, respectively.

3. The memory module of claim 2, wherein the daisy chain pattern of the first printed circuit board and the daisy chain pattern of the second printed circuit board independently transfer the electrical signals to the host device.

4. The memory module of claim 3, wherein, when the first printed circuit board is determined as faulty, the host device is disconnected from the first printed circuit board.

5. The memory module of claim 1, wherein a component is installed in a second region of the first printed circuit board, and wherein the daisy chain pattern is spaced from the second region by a first distance.

6. The memory module of claim 5, wherein the first printed circuit board offsets a signal of the second region and a signal of the first region.

7. The memory module of claim 1, wherein the daisy chain pattern includes a dummy net of the first printed circuit board.

8. A memory module protection circuit, comprising:
a first printed circuit board having first and third edges opposite each other and second and fourth edges opposite each other;
a first socket and a second socket connectable with a host device;
a plurality of sockets disposed between the first socket and the second socket, wherein the plurality of sockets and the first and second sockets are disposed at the first edge; and
a daisy chain pattern formed in an edge region of the first printed circuit board and connected with the first socket and the second socket, wherein the dais chain pattern extends from the first socket along the second edge, the third edge and the fourth edge to the second socket, and
wherein the host device determines a characteristic of the first printed circuit board based on information about an electrical signal of the daisy chain pattern.

9. The memory module protection circuit of claim 8, wherein the host device determines the characteristic of the first printed circuit board based on an impedance of the first printed circuit board, or a propagation delay of the first printed circuit board.

10. The memory module protection circuit of claim 9, wherein the host device determines whether the first printed circuit board is faulty, based on a determination result indicating the characteristic of the first printed circuit board.

11. The memory module protection circuit of claim 10, wherein, when the first printed circuit board is determined as faulty, the host device releases its connection with the first printed circuit board.

12. The memory module protection circuit of claim 8, wherein a component is installed in an inner region of the first printed circuit board,
wherein the daisy chain pattern is spaced from the inner region by a first distance, and
wherein the inner region and the edge region are spaced from each other by a second distance.

13. The memory module protection circuit of claim 12, wherein the host device offsets a signal of the inner region and a signal of the edge region based on a determination result indicating that damage is from outside the first printed circuit board.

14. The memory module protection circuit of claim 9, wherein the host device determines whether a fault is present in the first printed circuit board before recognizing a memory chip of the first printed circuit board.

15. The memory module protection circuit of claim 9, wherein the daisy chain pattern includes a dummy net of the first printed circuit board.

16. A memory module protection system, comprising:
a first printed circuit board having first and third edges opposite each other and second and fourth edges opposite each other;
a first socket and a second socket connectable with a host device provided outside the memory module protection system;
a plurality of sockets disposed between the first socket and the second socket, wherein the plurality of sockets and the first and second sockets are disposed at the first edge; and
a daisy chain pattern provided in an edge region of the first printed circuit board and connected with the first socket and the second socket, wherein the dais chain pattern extends from the first socket along the second edge, the third edge and the fourth edge to the second socket, and
wherein the host device determines a characteristic of the first printed circuit board based on information about an electrical signal of the daisy chain pattern.

17. The memory module protection system of claim 16, wherein the host device determines the characteristic of the first printed circuit board based on an impedance of the first printed circuit board, a propagation delay of the first printed circuit board, or a connection state between the first printed circuit board and a second printed circuit board connected with the first printed circuit board.

18. The memory module protection system of claim 17, wherein the host device determines whether the first printed circuit board is faulty, based on a determination result indicating the characteristic of the first printed circuit board.

19. The memory module protection system of claim 16, wherein, when the first printed circuit board is determined as faulty, the host device releases its connection with the first printed circuit board.

20. The memory module protection system of claim 16, wherein a component is installed in an inner region of the first printed circuit board,
wherein the daisy chain pattern is spaced from the inner region by a first distance, and
wherein the inner region and the edge region are spaced from each other by a second distance.

\* \* \* \* \*